United States Patent
Gruber et al.

(10) Patent No.: US 7,626,427 B2
(45) Date of Patent: Dec. 1, 2009

(54) VOLTAGE COMPARATOR UTILIZING VOLTAGE TO CURRENT CONVERSION

(75) Inventors: Berthold Gruber, Bad Rappenau (DE); Lars Hehn, Heilbronn (DE)

(73) Assignee: Atmel Automotive GmbH, Heilbronn (DE)

( * ) Notice: Subject to any disclaimer, the term of this patent is extended or adjusted under 35 U.S.C. 154(b) by 0 days.

(21) Appl. No.: 11/196,415

(22) Filed: Aug. 4, 2005

(65) Prior Publication Data

US 2006/0028248 A1    Feb. 9, 2006

(30) Foreign Application Priority Data

Aug. 6, 2004    (DE)   ........................ 10 2004 038 552

(51) Int. Cl.
   *H03K 5/22*    (2006.01)
(52) U.S. Cl. ........................................... 327/81; 327/88
(58) Field of Classification Search .................. 327/58, 327/60, 62, 63, 65–68, 72, 77–81, 88
   See application file for complete search history.

(56) References Cited

U.S. PATENT DOCUMENTS

| | | | | |
|---|---|---|---|---|
| 4,047,059 A | * | 9/1977 | Rosenthal | 327/66 |
| 4,602,168 A | * | 7/1986 | Single | 327/65 |
| 4,607,232 A | * | 8/1986 | Gill, Jr. | 330/255 |
| 4,659,944 A | * | 4/1987 | Miller et al. | 327/97 |
| 5,077,491 A | * | 12/1991 | Heck et al. | 327/83 |
| 5,136,184 A | | 8/1992 | Deevy | |
| 5,276,359 A | * | 1/1994 | Chiang | 327/514 |
| 5,446,397 A | * | 8/1995 | Yotsuyanagi | 327/66 |
| 5,477,170 A | * | 12/1995 | Yotsuyanagi | 327/66 |
| 5,512,849 A | * | 4/1996 | Wong | 327/77 |
| 5,880,614 A | * | 3/1999 | Zinke et al. | 327/205 |
| 5,886,546 A | * | 3/1999 | Hwang | 327/103 |
| 5,910,748 A | * | 6/1999 | Reffay et al. | 327/432 |
| 5,945,852 A | * | 8/1999 | Kosiec | 327/68 |
| 5,990,742 A | * | 11/1999 | Suzuki | 330/253 |
| 6,008,673 A | * | 12/1999 | Glass et al. | 327/77 |
| 6,020,768 A | * | 2/2000 | Lim | 327/77 |
| 6,028,457 A | * | 2/2000 | Tihanyi | 327/77 |
| 6,037,890 A | | 3/2000 | Glass et al. | |
| 6,091,226 A | * | 7/2000 | Amano | 320/116 |
| 6,194,919 B1 | * | 2/2001 | Park | 327/52 |
| 6,275,073 B1 | * | 8/2001 | Tokuhiro | 327/66 |
| 6,788,114 B1 | * | 9/2004 | Krenzke et al. | 327/70 |
| RE39,918 E | * | 11/2007 | Slemmer | 327/78 |
| 2001/0013799 A1 | * | 8/2001 | Wang | 327/81 |

(Continued)

FOREIGN PATENT DOCUMENTS

DE    199 11 098 A1    12/1999

(Continued)

*Primary Examiner*—Lincoln Donovan
*Assistant Examiner*—William Hernandez
(74) *Attorney, Agent, or Firm*—Muncy, Geissler, Olds & Lowe, PLLC

(57) ABSTRACT

A voltage comparator for comparing a reference voltage with a threshold, includes a first voltage-to-current converter to convert a reference voltage that determines the threshold into a reference current that depends on the reference voltage, a second voltage-to-current converter to convert the comparison voltage into a comparison current that depends on the comparison voltage, and an output stage to output a digital output level, wherein the digital output level depends on the reference current and the comparison current.

23 Claims, 2 Drawing Sheets

U.S. PATENT DOCUMENTS

2001/0035777 A1* 11/2001 Wang et al. .................. 327/103
2003/0202617 A1* 10/2003 Casper ....................... 375/317
2003/0222680 A1* 12/2003 Jaussi ......................... 327/65
2005/0104628 A1* 5/2005 Tanzawa et al. ............... 327/63

FOREIGN PATENT DOCUMENTS

EP  0 669 717 A1  8/1995
EP  1 492 232 A1  12/2004

* cited by examiner

VOLTAGE COMPARATOR UTILIZING VOLTAGE TO CURRENT CONVERSION

This nonprovisional application claims priority under 35 U.S.C. § 119(a) on German Patent Application No. DE 102004038552.1, which was filed in Germany on Aug. 6, 2004, and which is herein incorporated by reference.

BACKGROUND OF THE INVENTION

1. Field of the Invention

The present invention relates to a voltage comparator.

2. Description of the Background Art

An object of Voltage comparators is comparing a comparison voltage with a reference voltage and reporting the result at an output with the least possible time lag. Analog comparators function as an interface between analog and digital functional units. The analog amplitude input signal (voltage) is transformed into a binary output signal (voltage). Either an H level (high level, high voltage) or an L level (low level, low voltage) appears at the output. Comparator circuits are, for example, special amplifiers, which, like operational amplifiers, can have a differential input and an asymmetrical output. The output stage of the comparator is generally designed such that it is compatible with the logic levels of several families of digital logic circuits. This means that digital circuits can be driven by the comparator output without interposing additional elements. In this regard, comparators can be operated with or without feedback (hysteresis).

Typical comparator applications are threshold switches (level detectors), window discriminators, rectifier circuits for small signals, Schmitt triggers and other multivibrator circuits, which are used for purposes including sharpening edges and converting time-varying, e.g. sinusoidal, voltages into a square-wave sequence.

SUMMARY OF THE INVENTION

It is therefore an object of the present invention to provide a voltage comparator that can be used to the greatest possible degree in, for example, the automotive field.

In an embodiment of the invention a comparator function is provided that, instead of a differential amplifier, uses currents that are to be compared. Accordingly, a voltage comparator for comparing a comparison voltage with a threshold is provided. The voltage comparator here preferably has a first voltage-to-current converter to convert a reference voltage that determines the threshold into a reference current that depends on the reference voltage. In the simplest case the reference voltage is a constant voltage, for example a Zener voltage or supply voltage. However, the reference voltage can be an adjustable voltage, for example an analog output voltage of a microcontroller. In order to generate the reference current, the first voltage-to-current converter advantageously acts at its output like a reference-voltage-dependent current source with an internal resistance.

The comparator requires a second voltage-to-current converter to convert the comparison voltage into a comparison current that depends on the comparison voltage. With respect to the comparison current, the second voltage-to-current converter advantageously acts at its output like a comparison-voltage-dependent current source with an internal resistance.

In addition, the comparator has an output stage to output a digital output level, wherein the digital output level depends on the reference current and comparison current. The dependence of the output level here implements the comparator function, in that, for example, a first output level (high) is associated with a comparison voltage above a first threshold, and a second output level (low) is associated with a comparison voltage below a second threshold, where the first and second thresholds can be equal or different, and implement a function of a window comparator, for example.

An embodiment of the invention provides for the output stage to be connected to a current summing node in which the comparison current and a threshold current depending on the reference current are summed, wherein one of the two currents enters into the summation as a negative value. The sum of the currents flowing into and out of the current summing node is always zero here. The relationship of the dependence between the threshold current and the reference current in this regard is specified by a mathematical function.

In a further embodiment of the invention, means are provided for multiplying the reference current by a multiplication factor, so that the threshold current generated using the multiplication factor enters into the summation in the current summing node. For example, to multiply the current a multiple of the reference current can be wired to the threshold current by, for example, NMOS or PMOS transistors. For further development of the invention there is provided for this purpose a reference current mirror whose current mirror ratio can be adjusted, and in particular switched, as a means for multiplication. For example, multiple transistors that control the mirrored current of the reference current mirror can be wired in parallel. To adjust the multiplication factor, one or more of these controlling transistors are activated or deactivated, for example, by changing its gate voltage.

A further embodiment of the invention provides for the output level to be determined by a voltage at the current summing node, which voltage depends on the comparison current and the threshold current. In this regard, the voltage comparator is preferably dimensioned such that the voltage in the current summing node changes significantly in the region in which the values of the comparison current and the threshold current are close to one another. Preferably, the voltage at the current summing node is independent of the electrical characteristics of the output stage here; to this end, the latter preferably has a high-impedance input.

The output stage and following digital analysis circuits, and preferably the circuit generating the voltage reference, are preferably produced with transistor characteristics for low breakdown voltages of 10 V. Low breakdown voltages permit small structure width, which permits high integration density, especially for digital analysis circuits or communications circuits. Therefore, in a embodiment of the invention a voltage limiter is provided for limiting the voltage present between the current summing node and the ground connection.

One example of such a voltage limiter is a Zener diode that is connected to the current summing node and the ground connection. Above the Zener voltage, an additional Zener current flows out of the current summing node through the Zener diode. In another embodiment of the invention, provision is made, without a Zener current, for the current summing node to be connected through at least one (second) transistor to a current mirror that is connected to the second voltage-to-current converter. This transistor, which acts as a voltage-limiter, has a higher breakdown voltage here than the output stage. In particular, the high breakdown voltage rating of this transistor makes it possible to use the voltage comparator as an integral part of a circuit with what is called smart power technology for use in, for example, a motor vehicle with a 42V on-board supply voltage. To this end, this transistor preferably has a breakdown voltage rating of 80V.

The transistor acting as a voltage limiter can be wired as an emitter follower. Thus, the gate or the base of this transistor is or can be connected to the supply voltage of the output stage.

If reference voltages greater than the maximum permissible voltage in the output stage are also required, an embodiment of the invention provides that the current summing node is connected to the first voltage-to-current converter through another transistor, wherein this transistor, which functions as a voltage-limiter, also has a higher breakdown voltage rating than the output stage. Preferably, the gate or the base of this transistor likewise is or can be connected to the supply voltage of the output stage.

A further embodiment of the invention provides that the first voltage-to-current converter and the second voltage-to-current converter can be arranged on a semiconductor chip adjacent to one another or placed within one another. This has the effect that both converters are exposed to essentially the same operating temperature in this region of the semiconductor chip. Moreover, the effects of manufacturing tolerances, which arise across the entire area of a semiconductor chip, will only be minor in this region of the adjacent or nested converters. This "matching" of the two converter structures on the semiconductor chip is used so that the first voltage-to-current converter and the second voltage-to-current converter have identical components. This permits a very similar response of the two converters to physical effects such as temperature changes or mechanical stresses.

Another embodiment of the invention is implemented in that at least one of the two voltage-to-current converters can have a current mirror with at least one resistor connected in series. Assuming essentially linear resistors, the behavior of the voltage-to-current converter can therefore be assumed to be essentially linear above one or more threshold voltages of the current mirror. For voltages below the threshold voltage, the voltage-to-current converter remains inactive, so that only a very low quiescent current is needed in the inactive state.

Provision is made in one embodiment of the invention to provide, in addition to the reference current and the comparison current, a generator for generating a cross current, which preferably depends on the reference current, wherein the cross current enters into the summation at the current summing node once with a negative sign and once with a positive sign.

When the comparison voltage changes only very slowly in the region of the threshold during a period of time, the voltage may in some cases also change only slowly between the binary value 0 and the binary value 1. Thus, the output stage preferably has a Schmitt trigger whose output is connected to the current summing node.

The comparison voltage can, for example, be present between an input and a ground connection of the voltage comparator. However, as a variation from this, an embodiment of the invention provides that the comparison voltage is a differential voltage present at two inputs of the voltage comparator. The differential voltage here can differ significantly from a common-mode input voltage present at the two inputs.

In yet a further embodiment of the invention, provision is made that the second voltage-to-current converter is designed to convert a positive and a negative differential voltage, wherein for this purpose the second voltage-to-current converter preferably has a first current mirror associated with the positive differential voltage and a second current mirror associated with the negative differential voltage.

In order to also incorporate the comparator in a power management system of a motor vehicle, a device or switch for switching off the supply voltage of the output stage is preferably provided, so that the voltage comparator can be switched between a sleep mode and an operating mode. A special aspect of the invention is the use of an above-described voltage comparator in a circuit for analyzing and/or monitoring a voltage generated by a charge pump.

Another aspect of the invention is an analog-digital converter, especially using the successive approximation method or counting method to convert a comparison voltage curve over time into digital output signals with the above-described voltage comparator.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
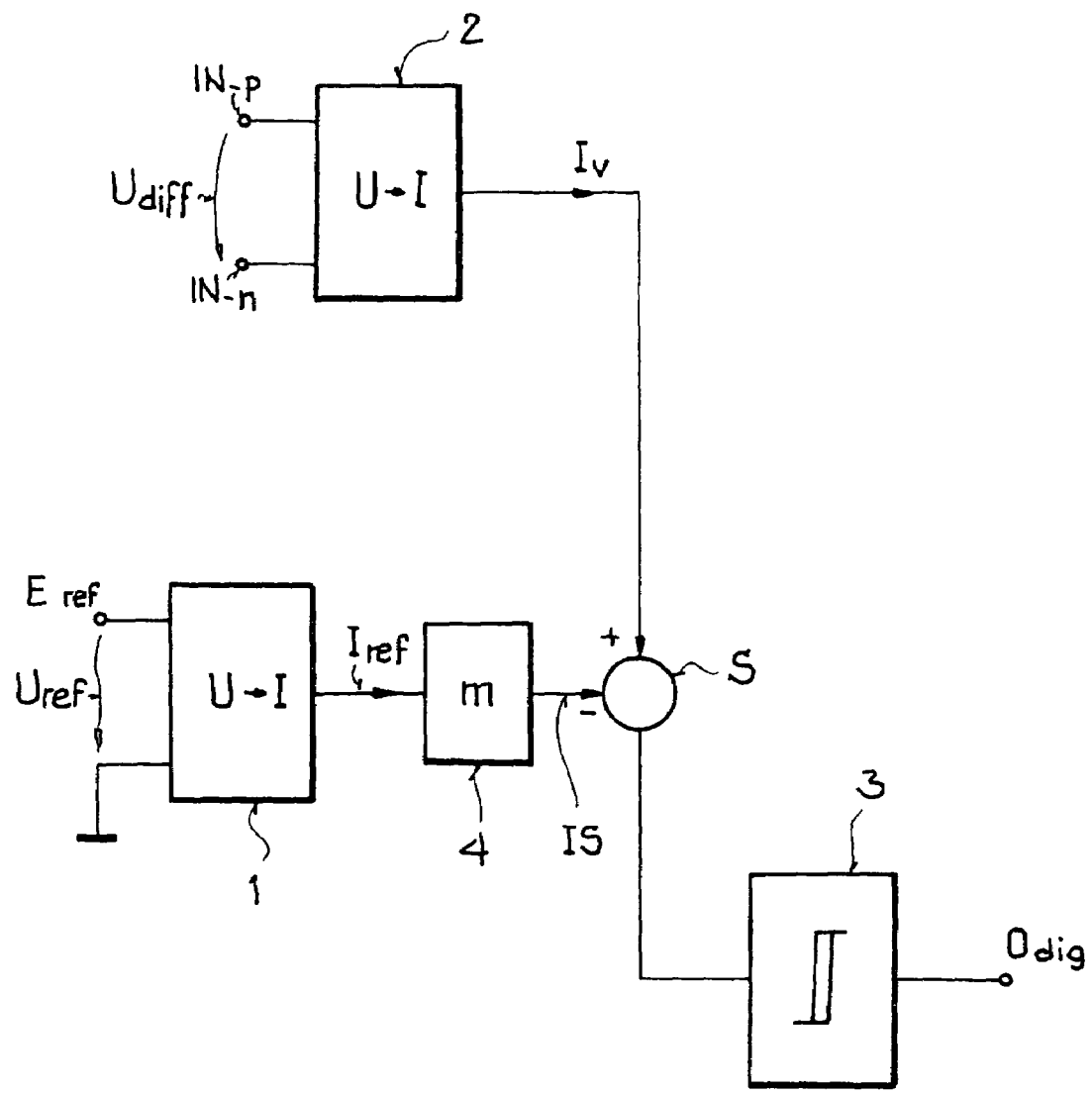
FIG. 1 shows a schematic block diagram of the voltage comparator according to an embodiment of the present invention.

FIG. 1 shows a block diagram of a voltage comparator. The voltage comparator has a first voltage-to-current converter 1, which converts a reference voltage $U_{ref}$ at the input $E_{ref}$ into the current $I_{ref}$. In the example embodiment shown, the current direction of the reference current $I_{ref}$ is out of the voltage-to-current converter 1. The reference voltage $U_{ref}$ here is referenced to a ground connection.

The first voltage-to-current converter 1 is followed by a multiplier 4, which multiplies the reference current $I_{ref}$ by the multiplication factor m. The multiplication factor m is preferably adjustable in stages from 0.5 to 10. The threshold current $I_s$ in turn depends on the reference current $I_{ref}$. In the example embodiment shown in FIG. 1, the dependency is given by the multiplication factor m, so that, when the effect of a comparison current $I_v$ is neglected, $$I_s = m * I_{ref}$$

In addition, there is provided a second voltage-to-current converter 2 which converts a differential voltage $U_{diff}$ present at the inputs $IN_{-p}$ and $IN_{-n}$ into the comparison current $I_v$. The output of the second voltage-to-current converter 2 is connected to a current summing node S. The multiplier 4 is likewise connected to a current summing node S, wherein in this example embodiment the comparison current $I_v$ flows into the current summing node S with a positive arithmetic sign, while the threshold current $I_s$ enters into the summation in the current summing node S as a negative quantity.

In addition, the current summing node S is connected to an output stage 3 whose Schmitt-trigger input has a high impedance so that the current flowing in the output stage 3 can be neglected. Since the sum of all currents flowing into and out of the current summing node S must be zero, the threshold current $I_s$ must be equal to the comparison current $I_v$ in the schematically shown example embodiment.

For a low comparison current $I_v$, the current flow through the current summing node S is determined by the comparison current $I_v$. The first multiplication factor 4 thus acts as a current sink, which can however accept a larger current than that which flows as a result of the comparison current $I_v$. Consequently, in this state the voltage relative to ground at the current summing node S is low and is below the threshold of the Schmitt trigger of the output stage 3. If the comparison current $I_v$ rises further, it will reach the order of magnitude that can be accepted by the multiplier 4 acting as a current sink. Upon reaching this threshold, the current is limited to a value of the threshold current $I_s$ that depends on the reference voltage $U_{ref}$.

If the differential voltage $U_{diff}$ rises further, the current flowing through the current summing node S remains essentially constant. As a result of the fact that the second voltage-to-current converter 2 acts as a current source with an internal resistance, the voltage at the current summing node S rises significantly and exceeds the threshold of the Schmitt trigger for the output stage 3. In order to use the voltage comparator for high on-board supply voltages of a motor vehicle, the second voltage-to-current converter 2 has a high breakdown voltage rating which is preferably at 80V or higher.

Consequently, this second voltage-to-current converter 2 is preferably designed to withstand high voltages in such a manner that it has a breakdown voltage rating that is significantly higher than the voltage values of the supply voltage VP of the output stage 3 or the maximum reference voltage $U_{ref}$ and is suited to a maximum common-mode input voltage that can be applied at the two inputs $IN_{-p}$ and $IN_{-n}$.

The output signals of the output stage 3 are binary digital square-wave signals with "high" and "low" states; in the example embodiment in FIG. 1 a differential voltage $U_{diff}$ that is above the threshold of the voltage comparator determined by the reference voltage $U_{ref}$ is associated with a "high" signal, and a differential voltage $U_{diff}$ that is below the threshold of the comparator determined by the reference voltage $U_{ref}$ is associated with a "low" signal.

The output stage 3 of the comparator is preferably designed such that it is compatible with the logic levels of multiple circuit families. This means that digital circuits can be driven by the comparator output without interposing additional elements. In an alternative to the representation in FIG. 1, the comparator output can advantageously be switched off by, for example, a strobe connection. When the output is switched off, the output has a high-impedance. This has in particular the advantage that multiple comparators can be connected to a common bus line. In this context, only one output at a time is activated; the others having high-impedances do not affect the output of the connected active comparator.

Figure 2:
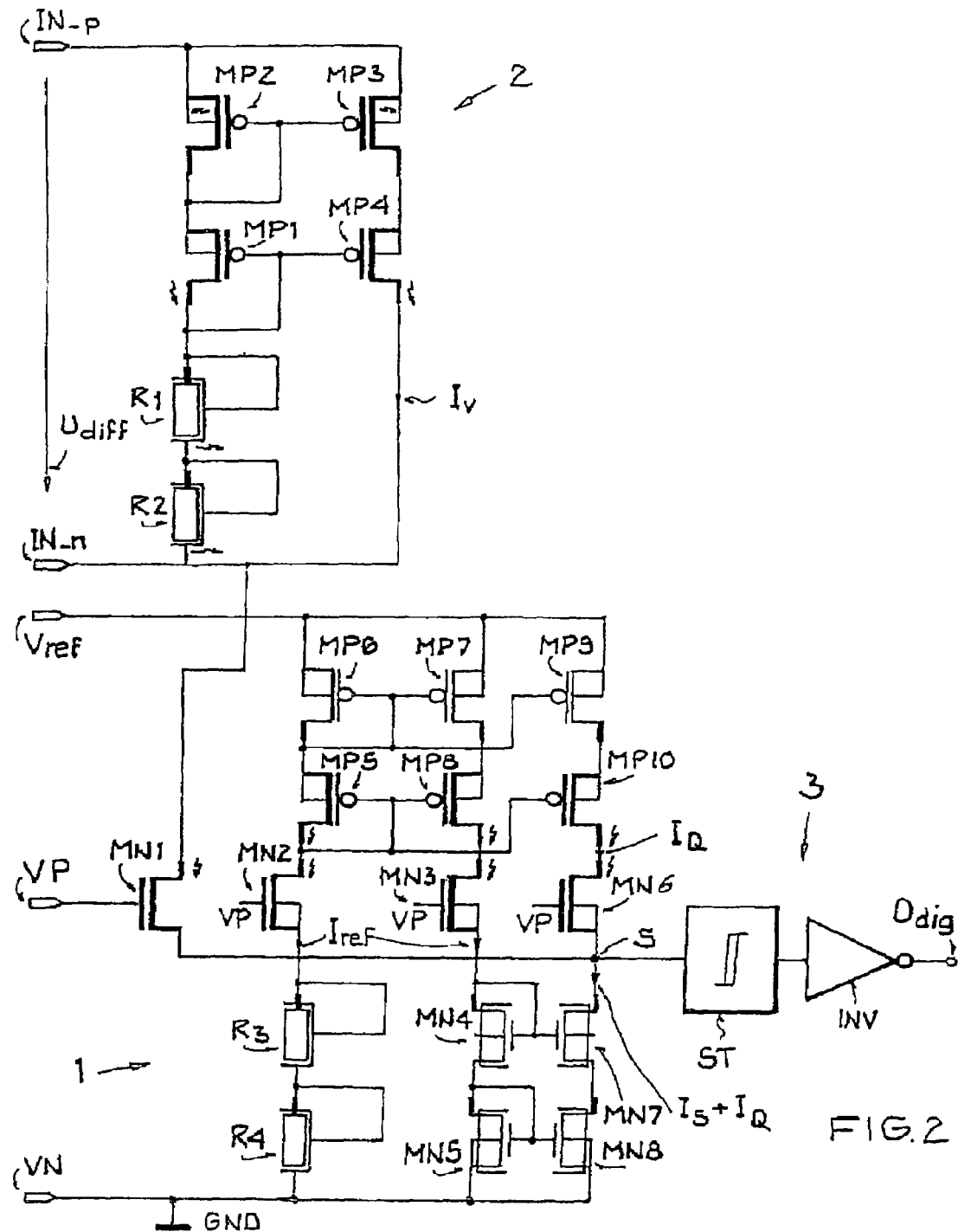
FIG. 2 shows a circuit diagram of the voltage comparator at the transistor level.

FIG. 2 shows an example embodiment of the invention at the transistor level. The first voltage-to-current converter 1 and the second voltage-to-current converter 2 each have two resistors, R3, R4 and R1, R2 respectively, which are wired in series with a current mirror consisting of PMOS transistors MP5 through MP8 and MP1 through MP4, respectively. When the differential voltage $U_{diff}$ or the reference voltage $U_{ref}$ respectively, exceeds twice the threshold voltage, a current begins to flow through the PMOS transistors MP5 through MP8 or MP1 through MP4, respectively, and through the resistors R3, R4 or R1, R2, respectively. This current is mirrored by the relevant current mirror. In addition, the circuit in FIG. 2 has a switchable current mirror of NMOS transistors MN4, MN5, MN7, MN8. The mirroring ratio of the switchable current mirror can be changed by switching transistors, which are not shown in FIG. 2.

The PMOS transistors MP5 through MP8 and the resistors R3, R4 of the first voltage-to-current converter 1 and the PMOS transistors MP1 through MP4 and the resistors R1, R2 of the second voltage-to-current converter 2 are essentially the same in this example. The corresponding PMOS transistors MP1 through MP5, etc., have substantially the same aspect ratio for this purpose. Similarly, the resistors R1 through R4 are produced by substantially the same technology step. Moreover, it is especially advantageous to achieve a good "matching" in that these PMOS transistors MP1 through MP8 and resistors R1 through R4 are arranged adjacent to one another or are nested within one another. This has the effect that these circuit components have essentially the same properties for different operating temperatures.

In order to provide usability with a 42V electrical system of a motor vehicle, at least the PMOS transistors MP1 through MP4 are designed as high-voltage PMOS transistors with a breakdown voltage rating of 80V. The output stage 3 has a Schmitt trigger ST, and an inverter INV that is connected to the output $O_{dig}$ of the voltage comparator. One supply voltage connection VN is at ground GND, while the other supply voltage connection VP is connected to a supply voltage of 5V which also supplies subsequent digital circuits not shown in FIG. 2. The maximum breakdown voltage rating of the Schmitt trigger ST is designed with reference to the supply voltage VP of 5V, and reaches values between 8V and 10V, for example.

If the second voltage-to-current converter 2 attempts to drive a large current $I_v$, the voltages exceeding 10V would destroy the input transistors of the Schmitt trigger ST. The NMOS transistor MN1, which has a breakdown voltage rating corresponding at least to that of one of the transistors MP1 through MP4, is provided in order to limit the voltage appearing at the current summing node S. Since this NMOS transistor MN1 is connected as a source follower, the maximum voltage at the source connection is the supply voltage VP minus the threshold voltage of the transistor MN1 insofar as a current is flowing from the drain to the source. If the reference voltage $U_{ref}$ likewise significantly exceeds the supply voltage VP, then additional NMOS transistors MN2, MN3 or MN6 can be provided as a limiter, as shown in FIG. 2. Furthermore, the transistors MN1, MN2, MN3 or MN6 can also serve to switch the currents $I_v$, $I_{ref}$, $I_Q$ in or out.

The reference voltage $U_{ref}$ in this example embodiment is applied to the voltage comparator from outside. The components of the voltage comparator are preferably integrated on a semiconductor chip, with the reference voltage $U_{ref}$ being connectable to a connection of the semiconductor chip. Naturally, as an alternative it is also possible to generate the reference voltage $U_{ref}$ inside the voltage comparator.

A further current $I_Q$ also enters into the summation at the current summing node S in addition to the comparison current $I_v$ and the threshold current $I_s$. This current can be designated cross current $I_Q$, which enters the current summation at the current summing node S both positively and negatively, and thus merely passes through the current summing node S. In the example embodiment in FIG. 2, the cross current $I_Q$ is mirrored by the reference current $I_{ref}$.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A voltage comparator for comparing a comparison voltage with a threshold, the voltage comparator comprising:
   a first voltage-to-current converter for converting a reference voltage, which determines the threshold, into a reference current that depends on the reference voltage;
   a second voltage-to-current converter for converting the comparison voltage into a comparison current that depends on the comparison voltage;
   an output stage for outputting a digital output level, the digital output level being dependent on the reference current and the comparison current, the output stage being connected to a current summation node, wherein the comparison current and a threshold current are added, wherein the threshold current is dependent on the reference current, wherein at least one of the threshold current or the comparison current assumes a negative value in the summation; and
   a transistor configured to limit the voltage applied between the current summation node and a ground connection of the output stage,
   wherein the current summation node is configured to be connected via the transistor to the second voltage-to-current converter, the transistor having a higher breakdown voltage than the output stage.

2. The voltage comparator according to claim 1, wherein the output stage is connected to a current summing node in which the comparison current and a threshold current, which depends on the reference current, are summed, and wherein one of the comparison current or the threshold current enters into the summation as a negative value.

3. The voltage comparator according to claim 2, wherein the reference current is multiplied by a multiplication factor so that the threshold current entering into the summation in the current summing node depends on the multiplication factor and the reference current.

4. The voltage comparator according to claim 3, wherein a reference current mirror, whose current mirror ratio can be adjusted or switched, is provided to multiply the reference current by the multiplication factor.

5. The voltage comparator according to claim 2, wherein the digital output level is determined by a voltage at the current summing node, which voltage depends on the comparison current and the threshold current.

6. A voltage comparator for comparing a comparison voltage with a threshold, the voltage comparator comprising:
   a first voltage-to-current converter for converting a reference voltage, which determines the threshold, into a reference current that depends on the reference voltage;
   a second voltage-to-current converter for converting the comparison voltage into a comparison current that depends on the comparison voltage;
   an output stage for outputting a digital output level, the digital output level being dependent on the reference current and the comparison current; and
   a voltage limiter for limiting the voltage present between the current summing node and a ground connection of the output stage,
   wherein the output stage is connected to a current summing node in which the comparison current and a threshold current, which depends on the reference current, are summed, and wherein one of the comparison current or the threshold current enters into the summation as a negative value.

7. The voltage comparator according to claim 6, wherein the current summing node is connected through at least one first transistor to a current mirror that is connected to the first voltage-to-current converter, and wherein the first transistor, which functions as a voltage limiter, has a higher breakdown voltage rating than the output stage.

8. The voltage comparator according to claim 7, wherein the gate or the base of the first transistor is connected to a supply voltage of the output stage.

9. The voltage comparator according to claim 6, wherein the current summing node is connected to the first voltage-to-current converter through a second transistor, the second transistor being a voltage-limiter and has a higher breakdown voltage rating than the output stage.

10. The voltage comparator according to claim 9, wherein a gate or a base of the second transistor is connected to a supply voltage of the output stage.

11. The voltage comparator according to claim 1, wherein the first voltage-to-current converter and the second voltage-to-current converter are arranged on a semiconductor chip adjacent to one another or placed within one another.

12. The voltage comparator according to claim 1, wherein the first voltage-to-current converter and the second voltage-to-current converter have the same components.

13. The voltage comparator according to claim 1, wherein the first voltage-to-current converter has a current mirror with at least one resistor connected in series, and/or the second voltage-to-current converter has a current mirror with at least one resistor connected in series.

14. A voltage comparator for comparing a comparison voltage with a threshold, the voltage comparator comprising:
   a first voltage-to-current converter for converting a reference voltage, which determines the threshold, into a reference current that depends on the reference voltage;
   a second voltage-to-current converter for converting the comparison voltage into a comparison current that depends on the comparison voltage; and
   an output stage for outputting a digital output level, the digital output level being dependent on the reference current and the comparison current,
   wherein the output stage is connected to a current summing node in which the comparison current and a threshold current, which depends on the reference current, are summed, and wherein one of the comparison current or the threshold current enters into the summation as a negative value, and
   wherein a cross current is generated that depends on the reference current, wherein the cross current enters into the summation at the current summing node once with a negative sign and once with a positive sign, in addition to the reference current and the comparison current.

15. The voltage comparator according to claim 2, wherein the output stage has a Schmitt trigger whose output is connected to the current summing node.

16. The voltage comparator according to claim 1, wherein components of the voltage comparator are integrated on a semiconductor chip, and wherein the reference voltage is connected to a connection of the semiconductor chip.

17. The voltage comparator according to claim 1, wherein the comparison voltage is a differential voltage that is provided to inputs of the voltage comparator.

18. The voltage comparator according to claim 17, wherein the second voltage-to-current converter converts a positive and a negative differential voltage, wherein the second voltage-to-current converter has a first current mirror associated with the positive differential voltage and a second current mirror associated with the negative differential voltage.

19. The voltage comparator according to claim 17, wherein the second voltage-to-current converter has a breakdown voltage rating that is higher than the voltage values of a supply voltage of the output stage or a maximum reference voltage and is suited to a maximum common-mode input voltage that can be applied at two inputs.

20. The voltage comparator according to claim 1, further comprising a switch for switching off a supply voltage of the output stage so that the voltage comparator is switched between a sleep mode and an operating mode.

21. The voltage comparator according to claim 1, wherein the voltage comparator analyzes and/or monitors a voltage generated by a charge pump.

22. An analog to digital converter that uses a successive approximation method or counting method to convert a comparison voltage curve over time into digital output signals with a voltage comparator according to claim 1.

23. The voltage comparator according to claim 1, wherein the output of the comparator is compatible with the logic levels of multiple circuit families.

* * * * *